(12) United States Patent
Nygren et al.

(10) Patent No.: US 7,268,620 B2
(45) Date of Patent: Sep. 11, 2007

(54) PRE-DISTORTION OF NON-LINEAR DEVICES

(75) Inventors: Thorsten Nygren, Täby (SE); Leonard Rexberg, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 220 days.

(21) Appl. No.: 10/508,314

(22) PCT Filed: Mar. 14, 2003

(86) PCT No.: PCT/SE03/00425

§ 371 (c)(1),
(2), (4) Date: Apr. 25, 2005

(87) PCT Pub. No.: WO03/079545

PCT Pub. Date: Sep. 25, 2003

(65) Prior Publication Data

US 2005/0237111 A1     Oct. 27, 2005

(30) Foreign Application Priority Data

Mar. 19, 2002    (SE)    .................................... 0200861

(51) Int. Cl.
*H03F 1/26* (2006.01)
(52) U.S. Cl. ..................................... 330/149
(58) Field of Classification Search ................ 330/149; 375/297; 455/114.3
See application file for complete search history.

(56) References Cited

U.S. PATENT DOCUMENTS 6,246,865 B1 * 6/2001 Lee .......................... 455/114.3
7,136,628 B2 * 11/2006 Yang et al. ............... 455/114.3

OTHER PUBLICATIONS

Murali Tummla et al., "Volterra Series Based Modeling and Compensation of Nonlinearties in High Power Amplifiers", IEEE, 1997, pp. 2417-2420.
Sekchin, Chang et al., "A Compensation Scheme for Nonlinear Distortion in OFDM Systems", IEEE, 2000, pp. 736-740.
Anding Zhu et al., "An Adaptive Volterra Predistorter for the Linearization of RF High Power Amplifiers", IEEE MTT-S Digest, 2002, pp. 461-464.

* cited by examiner

*Primary Examiner*—Steven J. Mottola
(74) *Attorney, Agent, or Firm*—Nixon & Vanderhye P.C.

(57) ABSTRACT

New technology is described to calculate and optimize a pre-distorter avoiding the need of time-alignment between input and output of the amplifier. An analog output spectrum is used to compute an optimum pre-distorter, either in digital or analog format. The output spectrum is used to optimize intermodulation performance rather than trying to match the input spectrum to the output spectrum. The output spectrum (except for a possible gain constant) can be used as input to the optimization procedure. Since the intermodulation products usually are of much lower amplitude than the carriers themselves, it can be taken as the input spectrum without major loss of confinement. Mathematical procedures to calculate a pre-distorter using only the output signal are outlined.

5 Claims, 3 Drawing Sheets

US 7,268,620 B2

PRE-DISTORTION OF NON-LINEAR DEVICES

This application is the U.S. national phase of international application PCT/SE03/00425, filed 14 Mar. 2003, which designated the U.S. and claims priority to SE Application No. 0200861-3 filed 19 Mar. 2002. The entire contents of these applications are incorporated herein by reference.

TECHNICAL FIELD

The present invention relates to optimization of pre-distortion to linearize non-linear devices.

BACKGROUND

Linearization of inherently non-linear devices is necessary if distortion of signals through the device is to be minimized. Specifically when it concerns amplifiers in wireless communications it is in most cases necessary to limit spurious signal generation at out-of-band frequencies and also in some cases at in-band frequencies. One of the most frequently used techniques involves subtracting the unwanted signal portion from the output of the device by a feed-forward technique. The non-distorted input signal is then subtracted from an attenuated copy of the distorted output signal to give an estimate of the added spurious signal components, which may be again subtracted from the output signal by proper amplification and phase alignment. This technique is referred to as "Feed Forward" techniques, FF.

Another method to compensate for unwanted signal components is to find a mathematical operator which, if applied to the input signal, gives enough anti-distortion to compensate for the non-linearities of the device itself. This operator will if placed in a cascade configuration cancel out the unwanted signal components at the non-linear device output. This technique is referred to as "Pre-Distortion" techniques, PD.

A specific application of non-linear pre-distortion is to combat non-linear effects in power amplifiers for cellular communications. As capacity will drive the evolution of existing and forthcoming standards to deliver a higher number of user channels per bandwidth, amplifiers will have to be used in a broadband fashion. That is, if fed through a non-linear amplifier, these channels or frequencies would interfere with each other and also produce unwanted spurious signals in other frequency bands which are used by other network providers or mobile users.

A realization that uses the previously mentioned FF technique is the Multi Carrier Power Amplifier (MCPA). This device incorporates delicate tuning circuits for amplitude and phase matching so that only the distortion is subtracted from the output signal. A way to strengthen the linearization would be to cascade a pre-distorter or alternatively linearize the internal amplifier itself. In that process, it is expected that the overall efficiency will be increased. Another way is to take away the FF circuitry and solely rely on a good pre-distorter and good internal amplifier. It is believed that this would decrease manufacturing cost and also provide a simpler overall design.

State-of-the-art of pre-distortion compares samples of the signals measured at the input and output ports of a non-linear device, and then compensates by amplifying or attenuating the specific amplitude level. In this way, a non-linear amplitude characteristic function is obtained by which non-linear effects may be compensated for. Phase adjustment can be made in a similar way.

Another method may incorporate a more detailed algorithm whereby the characteristics of the non-linear device are tracked by time-dynamic methods such as expansion of the Volterra series, in order to find a closed expression for the device. The next step would then be to find an inverse to this function by the same expansion and apply it as a pre-distorter.

SUMMARY

The disclosure proposes a method to calculate and optimize the pre-distorter avoiding the need for time-alignment between input and output of the MCPA. The analog output spectrum is used to compute an optimum pre-distorter, either in digital or analog format.

The method of computing the parameters of the pre-distorter is usually to compare the input signal to the output signal, and then in some manner, adjust the parameters in such a way as to minimize distortion at the output of the non-linear device. Usually, this means a careful time or phase alignment of input-to-output signals, which makes it a difficult task to actually implement. Moreover, it usually involves some sort of modelling of the pre-distorter in conjunction with the power amplifier. In this way, the optimization procedure is twofold in that it needs modelling of two items within the iteration procedure. It would be expected that the iteration process gets rather involved and also takes time to perform.

The output only method poses some problems as how to express the target signal and the actual mathematical equations to solve.

A solution to the above problem is to use the output spectrum to optimize intermodulation performance rather than trying to match the input spectrum to the output spectrum. The output spectrum (except for a possible gain constant) can be used as input to the optimization procedure. Since the intermodulation products usually are of much lower amplitude than the carriers themselves, it can be approximated the input spectrum. This disclosure outlines the mathematical procedures to calculate a proper pre-distorter using only the output signal.

As another feature, the spurious frequency components are suppressed to zero without the need for approximating the target input signal by a filtered version of the output signal. In this case, only information is needed about a gain constant and at which frequency components or frequency band the pre-distortion should achieve zero magnitude.

SHORT DESCRIPTION OF THE DRAWINGS

Figure 3:
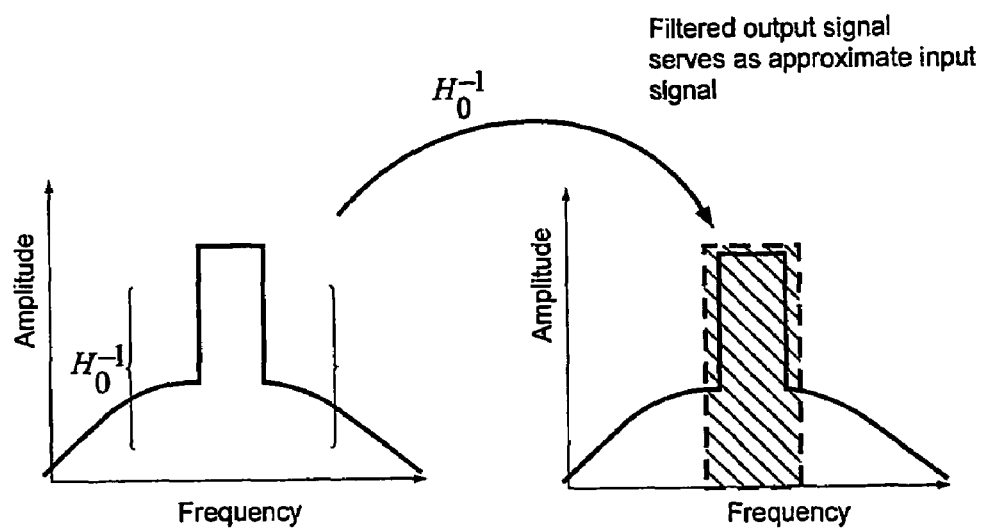
FIG. 3 illustrates a first inversion method, wherein the output signal is inverted back to the input signal by using a filtered version of the output signal as an approximation of the original input signal, whereby the inverter also tries to keep the in-band frequency components of the spurious spectrum intact.
Figure 4:
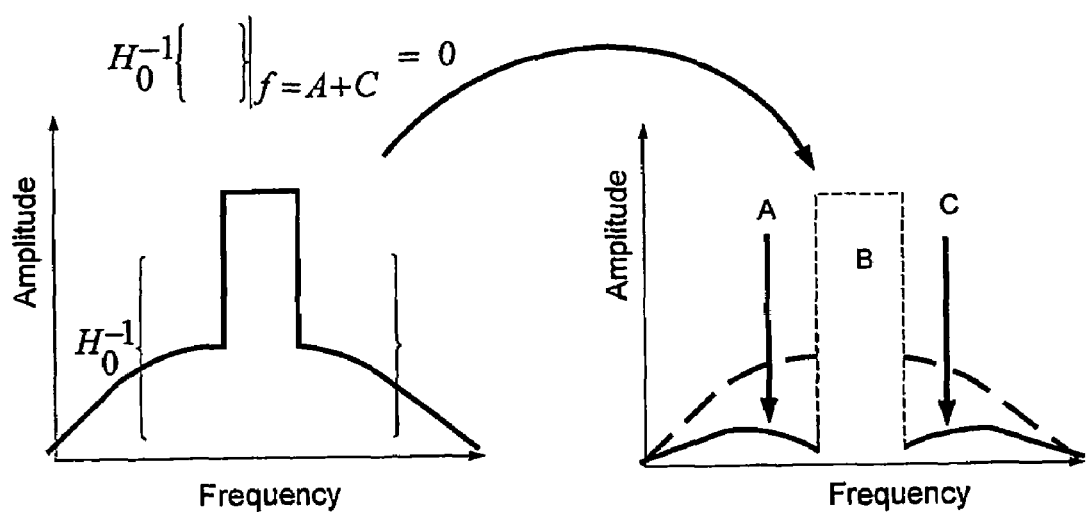
Figure 5:
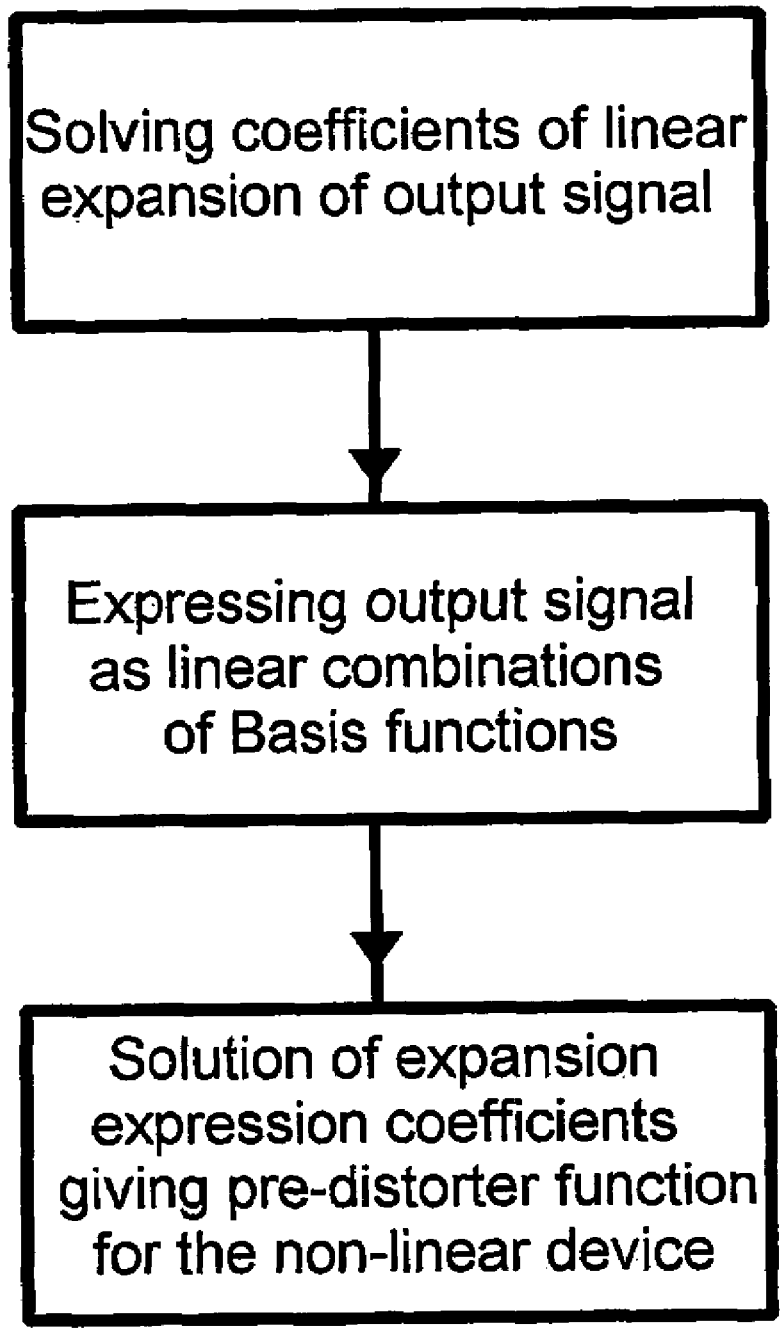

FIG. 4 illustrates optimizing of a pre-distorter using only the output signal, whereby the pre-distorter is optimized to produce no spurious frequency components in frequency regions A+C, and the result is that no spurious frequency components at in-band frequency spectrum need to be maintained thereby producing a "cleaner" spectrum than in FIG. 3; and FIG. 5 illustrates the example steps of the method.

TECHNICAL DESCRIPTION

Least Mean Squares Approach

It is tempting to insert a general pre-distorter at the input of a non-linear device, and then try to optimize the parameters in such a way that a given cost-function at the output of that device is minimized. However, such an attempt will drive the optimization algorithm to local minima. In general, it is difficult to find a good solution to the optimization problem in this way. Another way is to invert the output signal so as to equal the input signal. This inverter can then act as the pre-distorter. As stated above and will be described further below, it is also possible to use just the output signal itself for the calculations with only minor knowledge of the input signal.

Figure 1:
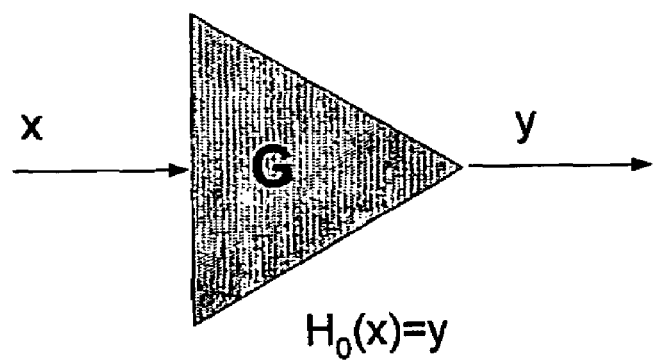
FIG. 1 illustrates an amplifier with an amplitude gain G, and being described by a non-linear operator $H_0(x)$, the gain G being defined by the relation of average power ratio of x and y.

In view of FIG. 1 the following equation is set forth, together with the inverse solution to the equation:

$$H_0[x]=y \Rightarrow x=H_0^{-1}[y] \qquad (1)$$

Figure 2:
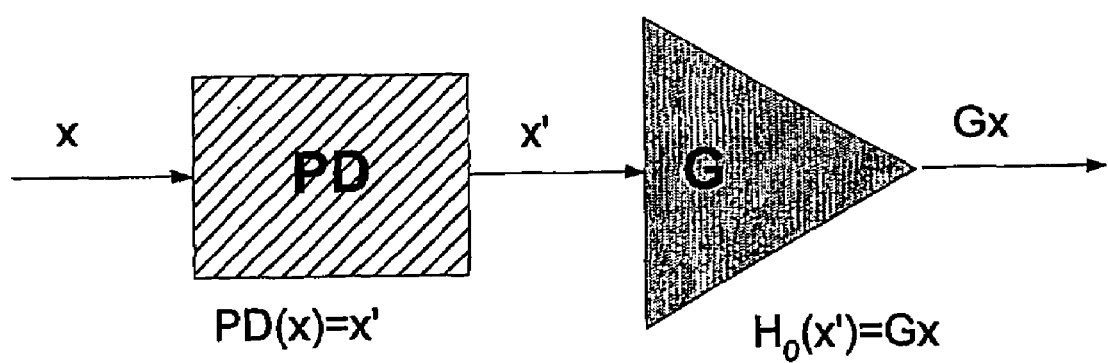
FIG. 2 illustrates a pre-distorter in a cascade configuration with a non-linear device, whereby the pre-distorter acts as an inverter to operator $H_0(x)$ except for the transfer gain (G) through the device.

Likewise, we may write for the signal equality in FIG. 2 that:

$$H_0[PD(x)]=G \cdot x \text{ or } PD(x)=H_0^{-1}[G \cdot x] \qquad (2)$$

So, the inverse operator of the non-linear device provides the pre-distorter function in a straightforward mathematical way. Equation (1) is then solved and the resulting non-linear operator applied in cascade with the non-linear device by compensating for the amplitude gain (G).

A somewhat simpler way to solve Equation (1) than first estimating $H_0$ and then inverting the operator is to solve for the inverse operator without solving for the forward case first, i.e., to solve for the following equation:

$$H_0^{-1}[y]=x \text{ or } F[y]=x \qquad (3)$$

The next step in the proposed method is to expand this operator in, for example, a dynamic Volterra series. Other expansions may also be successful. It can be shown [1] that if a system can be described in terms of a Volterra series and if the inverse operator exists, then there must also exist a complete Volterra series that equates to the inverse operator. Hence, this Volterra series can be directly applied to the input signal to give the necessary pre-distortion for a linear input/output relation.

Note that we are still discussing input-to-output relations at this stage. Later, this distinction is dropped for an output signal optimization only method.

Proceeding with the development of the pre-distorter we may conclude that for example a Volterra series expansion of the following form satisfies Equation (3) above:

$$\sum_n a_n y_{k-n} + \sum_n \sum_m a_{n,m} y_{k-n} y_{k-m} + \qquad (4)$$
$$\sum_n \sum_m \sum_p a_{n,m,p} y_{k-n} y_{k-m} y_{k-p} \ldots = x_k$$

for each time sample 'k'.

It should be mentioned that the Volterra series might not be the only possible description of the pre-distorter. To a designer skilled in the art it is obvious that also other functions or linear combinations of functions are possible. Specifically, the solution to the above Equation (4) may be obtained in a number of ways. In this disclosure we will be using the Least Mean Squares solution (LMS), but also other methods are possible. Further, using notations for Basis functions instead of the individual Volterra terms, we get the following equation in matrix form:

$$[B_{k,1} \; B_{k,2} \; B_{k,3} \; B_{k,4} \; \ldots] \cdot \begin{bmatrix} b_1 \\ b_2 \\ b_3 \\ \vdots \end{bmatrix} = x_k \qquad (5)$$

For instance in the above equation, $B=y_{k-n} y_{k-m} y_{k-p}$ and the b's correspond a's in Equation (4) above. It is also clear from Equation (5) that B can be any basis functions, which when linearly combined approximates the characteristics of the pre-distorter. If, for each instance of time sample k, new values for the Basis functions $B_k$ and for the $x_k$ values is computed and measured, respectively, we get:

$$\begin{bmatrix} B_{1,1} & B_{1,2} & B_{1,3} & \cdots \\ B_{2,1} & B_{2,2} & B_{2,3} & \cdots \\ B_{3,1} & B_{3,2} & B_{3,3} & \cdots \\ B_{4,1} & B_{4,2} & B_{4,3} & \cdots \\ B_{5,1} & B_{5,2} & B_{5,3} & \cdots \\ \vdots & \vdots & \vdots & \end{bmatrix} \cdot \begin{bmatrix} b_1 \\ b_2 \\ b_3 \\ \vdots \end{bmatrix} = \begin{bmatrix} x_1 \\ x_2 \\ x_3 \\ \vdots \end{bmatrix} \qquad (6)$$

The above matrix equation is over-determined, which means that the solution cannot be obtained from just inverting the matrix, since only quadratic matrices may be inverted. A solution to this is to apply the LMS solution, which is well understood and has been used in numerous other applications. The steps are as outlined below:

$$B \cdot b = x \qquad (7)$$

Multiply by $B^H$ (complex transpose) from the left:

$$B^H \cdot B \cdot b = B^H \cdot x \qquad (8)$$

which gives the following solution:

$$a=[B^H \cdot B]^{-1} \cdot B^H \cdot x \qquad (9)$$

The coefficients b of Equation (9) inserted into Equation (4) constitutes the full pre-distorter for the non-linear device. This is a solution found by only linear methods to an inherently non-linear problem. Below are specific methods of how to use the output signal to further enhance performance in terms of suppressing spurious frequencies while keeping the in-band signal unchanged. It should further be noted that Equation (9) incorporates both the input and output signals.

Frequency Version of LMS Approach

A frequency version of this method (as described above) may also be employed. Having in mind that each column of Equation (6) constitutes a time sweep for a particular Basis function (Volterra term), we may perform a Fourier transform on each of these columns separately, and also perform a Fourier transform of the right-hand side column. Now we have a frequency version of Equation (6), which may be solved by the same LMS procedure as outlined above. The result should be congruent with the solution shown in Equation (9), which expresses this equation in time domain.

The procedure of the Fourier transform method is outlined as follows. Assume the same equation as in Equation (6) above. We may write it as a function of time as:

$$\begin{bmatrix} B_{1,1}(t_1) & B_{1,2}(t_1) & B_{1,3}(t_1) & \cdots \\ B_{2,1}(t_2) & B_{2,2}(t_2) & B_{2,3}(t_2) & \cdots \\ B_{3,1}(t_3) & B_{3,2}(t_3) & B_{3,3}(t_3) & \cdots \\ B_{4,1}(t_4) & B_{4,2}(t_{24}) & B_{4,3}(t_{24}) & \cdots \\ B_{5,1}(t_5) & B_{5,2}(t_5) & B_{5,3}(t_5) & \cdots \\ \vdots & \vdots & \vdots & \end{bmatrix} \cdot \begin{bmatrix} b_1 \\ b_2 \\ b_3 \\ \vdots \end{bmatrix} = \begin{bmatrix} x_1(t_1) \\ x_2(t_2) \\ x_3(t_3) \\ \vdots \end{bmatrix} \downarrow \text{time} \downarrow \quad (10)$$

Now, taking the Fourier transform of each column in Equation (10) gives the following equation:

$$\begin{array}{c} FFT \\ \downarrow \end{array}$$

$$\begin{bmatrix} BF_{1,1}(\omega_1) & BF_{1,2}(\omega_1) & BF_{1,3}(\omega_1) & \cdots \\ BF_{2,1}(\omega_2) & BF_{2,2}(\omega_2) & BF_{2,3}(\omega_2) & \cdots \\ BF_{3,1}(\omega_3) & BF_{3,2}(\omega_3) & BF_{3,3}(\omega_3) & \cdots \\ BF_{4,1}(\omega_4) & BF_{4,2}(\omega_4) & BF_{4,3}(\omega_4) & \cdots \\ BF_{5,1}(\omega_5) & BF_{5,2}(\omega_5) & BF_{5,3}(\omega_5) & \cdots \\ \vdots & \vdots & \vdots & \end{bmatrix} \cdot \begin{bmatrix} b_1 \\ b_2 \\ b_3 \\ \vdots \end{bmatrix} = \begin{bmatrix} xF_1(\omega_1) \\ xF_2(\omega_2) \\ xF_3(\omega_3) \\ \vdots \end{bmatrix} \downarrow \text{frequency} \downarrow \quad (11)$$

Or in compact form:

$$BF \cdot a = xF \quad (12)$$

Equation (11) is a frequency version of the original Equation (6). In a like manner to the solution in Equation (9), the LMS solution to the frequency version as outlined in Equation (11) above is:

$$a = [BF^H \cdot BF]^{-1} \cdot BF^H \cdot xF \quad (13)$$

Frequency Weighting

A further improvement to the solution would be to multiply certain rows of Equation (10) corresponding to a certain frequency to obtain a weighting of these certain frequency responses. Spurious frequency components in certain frequency bands may be given higher importance than other frequency bands. This procedure will improve the solution to give a better pre-distortion performance.

$$\begin{bmatrix} BF_{1,1}(\omega_1) & BF_{1,2}(\omega_1) & BF_{1,3}(\omega_1) & \cdots \\ C_1 \cdot BF_{2,1}(\omega_2) & C_1 \cdot BF_{2,2}(\omega_2) & C_1 \cdot BF_{2,3}(\omega_2) & \cdots \\ C_2 \cdot BF_{3,1}(\omega_3) & C_2 \cdot BF_{3,2}(\omega_3) & C_2 \cdot BF_{3,3}(\omega_3) & \cdots \\ BF_{4,1}(\omega_4) & BF_{4,2}(\omega_4) & BF_{4,3}(\omega_4) & \cdots \\ BF_{5,1}(\omega_5) & BF_{5,2}(\omega_5) & BF_{5,3}(\omega_5) & \cdots \\ \vdots & \vdots & \vdots & \end{bmatrix} \cdot \begin{bmatrix} b_1 \\ b_2 \\ b_3 \\ \vdots \end{bmatrix} = \begin{bmatrix} xF_1(\omega_1) \\ C_1 \cdot xF_2(\omega_2) \\ C_2 \cdot xF_3(\omega_3) \\ \vdots \end{bmatrix} \quad (14)$$

This equation is then solved exactly as described above in the sense of Least Mean Squares.

Output Only LMS

As mentioned earlier, it is also possible to calculate the pre-distorter by extracting only the output signal. Now, let us assume that the non-linearity is limited so that only minor non-linearities occur in the output signal. Then we replace the signal "x" in Equations (4)-(9) by a filtered version of the amplifier signal "y". The filter may be coarse enough just to drop spurious emissions outside a given main frequency band. The difference to the original input signal is then the in-band distortion, which can often be accepted. Moreover, it turns out that minimizing out-of-band distortion will also have effect at in-band frequencies. Following this outlined path, the approximate solution to Equation (15) is outlined in Equation (16).

$$a = [B(y)^H \cdot B(y)]^{-1} \cdot B(y)^H \cdot x \quad (15)$$

$$\tilde{a} = [B(y)^H \cdot B(y)]^{-1} \cdot B(y)^H \cdot \text{filt}\{y\} \quad (16)$$

Where filt$\{y\} \approx x$ is a filtered version of the output signal y (see FIG. 3). We may assume that, if the distortion is small enough, a filtered version of the output signal may approximate the input signal. The only knowledge that is required of the input signal is the average power relation to the output signal, and to what extent the output-signal replica should be filtered. The latter issue may be satisfied by for example only requiring that the intermodulation products (or spurious frequency response) should be zero below some pre-defined threshold level. Even though this filtered version of the output signal contains in-band distortion components, it is assumed the level is low enough not to introduce large errors. Normally, for devices used to amplify signals, the above statement of low enough distortion is satisfied.

If the non-linear device is frequency dependent, the pre-distorter function can be improved by adding a pre-set frequency equalizer at the device input.

Direct Suppression of Spurious Frequencies

It is also possible to suppress the spurious frequency components of the output spectrum by just considering those frequencies alone. That is, without equating any inversion equation, we may suppress the unwanted spectrum directly. Let us as an example use the Volterra series expansion of the inverter in plain polynomial form without memory effects, and set the spurious frequencies to zero:

$$\begin{array}{c} a_0 \cdot FFT(y) + a_1 \cdot FFT(y^3) + a_2 \cdot FFT(y^5) \ldots = \\ 0|_{\text{spurious frequencies}} \end{array} \quad (17)$$

$$\begin{array}{c} a_1 \cdot FFT(y^3) + a_2 \cdot FFT(y^5) \ldots = -a_0 \cdot \\ FFT(y)|_{\text{spurious frequencies}} \end{array} \quad (18)$$

In Equation (18), we only use those rows in the general matrix, which correspond to those particular frequencies where we would like the spectrum to become zero (See parts A and C in FIG. 4). As seen, the right-hand-side of Equation (18) contains the apparently unknown coefficient $a_0$. However, as we know the amplification through the system, we also know this coefficient. So again we have a linear system of equations that can be solved by the LMS algorithm. The benefit of the latter method is that we no longer use a substitute for the in-band signal for the optimization. This avoids the LMS method trying to actually keep the output signal in the wanted frequency region, but rather tries to restore the input signal even in this frequency band.

It is also noted that the wanted in-band spectrum is not used in the formulation. This suggests that we would actually have no control of the in-band vector error. However, as the unwanted frequency components in Regions A and C in FIG. 4 are suppressed, then with a high confidence also the in-band spurious frequency components will also be suppressed.

Also in this case, if the non-linear device is frequency dependent, the pre-distorter function can be improved by adding a pre-set frequency equalizer at the device input.

Among the merits of the technology described is the fact that a linear method can be applied to an inherently non-linear problem. The Least Mean Squares solution is applied in a classical way to directly extract the coefficients of a linear combination of Basis functions. As an example, the coefficients of a Volterra series can be readily applied and solved by this method.

A second merit is that frequency weighting of the cost-function may be obtained as to pronounce certain frequency regions in favour of other bands. It is noted that the mathematical formulation is still a linear one, and no iterative search algorithm is used to find the optimum solution to the problem.

A third merit is that output-only optimization may be used effectively by reproducing the input signal characteristics from only the output signal and some minor knowledge such as wanted frequency band and power amplification.

A fourth merit is that the suggested improvement of just suppressing the unwanted frequency components gives the ability to pre-distort a non-linear device with the result of an output signal without vector errors. That is, the latter improvement searches to purely minimize the unwanted frequency components.

REFERENCES

[1] V. John Mathews, Giovanni L. Sicuranza, "Polynomial Signal Processing", ISBN 0471-03414-2.

The invention claimed is:

1. A method for optimization of pre-distortion of a non-linear device, comprising:

solving coefficients of a linear expansion expression for an output signal of the non-linear device;

expressing an inverter output signal as a linear combination of Basis functions which equates to an input signal of the non-linear device, whereby a solution for the coefficients of the linear expansion expression gives a pre-distorter function being an inverse operator to the non-linear device;

using the output signal of said non-linear device only as approximation of a target input signal of the non-linear device;

filtering out spurious frequency components, whereby parameters for filtering are frequency components of amplitudes below a pre-set threshold value; and adjusting a target input signal level by measuring linear gain of the non-linear device.

2. A method for optimization of pre-distortion of a non-linear device, comprising:

solving coefficients of a linear expansion expression for an output signal of the non-linear device; and expressing an inverter output signal as a linear combination of Basis functions which equates to an input signal of the non-linear device, whereby a solution for the coefficients of the linear expansion expression gives a pre-distorter function being an inverse operator to the non-linear device;

using the non-linear device output signal by suppressing a spurious frequency spectrum in the frequency domain, whereby a target input signal of the non-linear device is considered to have frequency components of zero magnitude outside a wanted spectrum.

3. The method according to claim 2, comprising:

expanding the output signal by a series representation, applying a Fourier transformation to each column of a matrix equation representing the output signal as a function of time to convert into frequency domain, assigning a coefficient to a linear part of the expansion to satisfy a gain requirement, and formulating a least mean squares approach or equivalent for remaining coefficients.

4. The method according to claim 3, comprising:

using for the series representation a dynamic Volterra series expansion.

5. A method to optimize an inverse operator for a distortion function associated with a non-linear amplifier, comprising:

minimizing an output signal spectrum of the inverse operator within certain frequency bands only using the amplifier output signal, and using different weighting factors in different frequency bands.

* * * * *